United States Patent [19]

Pray

[11] Patent Number: 4,545,062

[45] Date of Patent: Oct. 1, 1985

[54] EMPTY CAN COUNTER AND LIMITER

[75] Inventor: David M. Pray, Wales, Me.

[73] Assignee: Trenco, Inc., Portland, Me.

[21] Appl. No.: 419,579

[22] Filed: Sep. 17, 1982

[51] Int. Cl.⁴ .................... H03K 21/18; H03K 21/32; H03K 21/36; B65D 8/02

[52] U.S. Cl. ........................................ 377/6; 377/107; 220/1 T

[58] Field of Search .................. 377/6, 107; 220/1 T; D34/1, 7, 8, 9, 10, 11; 232/43.2, 44

[56] References Cited

U.S. PATENT DOCUMENTS

| | | |
|---|---|---|
| D. 215,345 | 9/1969 | Mangold et al. .................. D34/1 |
| 3,040,980 | 6/1962 | Mann et al. .......................... 377/6 |
| 3,441,719 | 4/1969 | Haller et al. ........................ 377/6 |
| 3,815,774 | 6/1974 | Olsson ............................... 220/1 T |

Primary Examiner—John S. Heyman

Attorney, Agent, or Firm—Sixbey, Friedman & Leedom

[57] ABSTRACT

The empty can counter and limiter includes a contoured plastic housing having an aperture for receiving the cans. This housing is adapted to fit on top of an open top type container and is contoured to direct one can at a time through a counting aperture. The electrical circuitry for the can counter includes a photosensor located to sense the passage of a can which interrupts a light beam. The output from the photosensor passes through a low pass filter which integrates the signal and provides it to a NAND gate. The output of the NAND gate drives the clock input of a divider flip flop which is connected to the clock input of an 8-bit counter. When a desired count is reached, the output of the counter activates an alarm which may be turned off by a reset switch. The reset switch will not operate to reset the counter until a predetermined count is registered.

9 Claims, 3 Drawing Figures

EMPTY CAN COUNTER AND LIMITER

DESCRIPTION

1. Technical Field

The present invention relates to object counting systems generally, and more particularly to an improved can orienting counting structure adapted to fit over standard can receiving receptacles and operative to indicate when the empty can limit of the receptacle is reached.

2. Background Art

In recent years, a number of states have instituted returnable container laws which require that a deposit be paid upon beverage cans by the consumer and that a refund be made to the consumer upon return of the can. In many states, the distributor has been made responsible for the implementation of the deposit and return procedure and the distributors must insitute a redemption program and remit the deposit fee plus handling fee to numerous retail outlets and can redemption centers where the returned containers are collected. To be effective, the empty can redemption process must be convenient for the consumer, and consequently each distributor must establish a large number of separate and individual can collection stations within his respective distribution area to receive empty cans for the beverage brands which he handles. Since each distributor may handle only a limited number of different beverage brands, there is often a necessity to provide a plurality of different empty can receptacles originating with different distributors at any one redemption location.

Normally, each distributor is required to place a large number of empty can receiving receptacles within his given district, and it is desirable that such receptacles be as inexpensive as possible. In many areas, the distributors have established a uniform method of redemption by having their own receptacles manufactured in uniform sizes, and then plastic bags are placed in the receptacles to store and retain the empty cans. The number of returnable cans to be received by the receptacle has been made uniform by the distributors according to receptacle size. The problem with this can redemption method is that it is necessary for personnel at the retail outlet or redemption center where each receptacle is placed to keep count of the number of cans as they are deposited into each distributor's receptacle. Since these personnel have other duties, it has proven practically impossible for them to maintain an accurate running count of the cans deposited into the multiplicity of receptacles for the different distributors. At best, these personnel can only ascertain that cans bearing the brands handled by a specific distributor are deposited into that distributor's receptacle. Thus, receptacles often become filled with a varying number of cans which require either the distributor or the personnel at the receiving location to institute a time consuming manual counting operation before the redemption process can be completed.

With an increased number of localities instituting returnable container laws, a tremendous need has arisen for an accurate, low cost device which would determine the number of cans deposited into existing distributor furnished receptacles. In the past, a number of units for electronically counting empty cans have been developed, but generally these units are incorporated as a section of a more complex machine which crushes or otherwise processes the received cans. U.S. Pat. Nos. 3,792,762, 3,857,334, 4,091,725, and 4,141,493 to Arp and U.S. Pat. Nos. 4,285,426 to Cahill and 4,248,334 to Hanley illustrate typical can counters of this type. The problem with these can counting machines is that the devices contain gears, motors and other metal parts which provide both a heavy and expensive machine, and such machines are not adapted for use with existing can collecting receptacles. Also, the expense of such machines will not permit a distributor to place a multiplicity of these machines in a number of receiving locations.

Existing technology has resulted in the development of effective photoelectric counting devices, such as the device illustrated in U.S. Pat. No. 3,045,910 to McLearn, but to this point, no such device has been incorporated in an effective structure to provide the orientation and counting of cans to be deposited into existing, conventional distributor provided receptacles.

DISCLOSURE OF THE INVENTION

It is a primary object of the present invention to provide a novel and improved empty can counter and limiter which combines a unique mechanical structure for properly receiving, orienting and passing a single can into a receptacle with an effective electronic circuit for registering the can passed and providing an indication when a predetermined number of cans have been passed into a receptacle. The can orienting structure consists of a unitary, light weight unit which is adapted to be removably secured to conventional can receiving receptacles.

Another object of the present invention is to provide a novel and improved empty can counter and limiter having no moving parts and which incorporates a simple electronic circuit to provide an accurate indication when a specified number of cans have been registered. When a desired count is reached, an alarm is activated which may be turned off by a reset switch which zeros the unit to begin a new count. The reset switch may not be operated to reset the unit for a new count until the predetermined count is reached, even if the reset unit is activated in the interim.

A further object of the present invention is to provide a novel and improved empty can counter and limiter which incorporates an electronic circuit for registering a number of cans up to a predetermined count. When the predetermined count is reached, the circuit may then be reset, but may not be reset in the interim. The circuit is provided with an auxiliary power supply which operates to maintain the registered count should the major power supply be discontinued.

A still further object of the present invention is to provide a novel and improved empty can counter and limiter including a mechanical structure which is adapted to be placed over a container for empty beverage cans. The unit can be programmed for a specified number of cans to be received by the container and operates to orient the cans and feed them one by one into the container. Once the container receives the predetermined count, an indicator system is activated to show that the container should be emptied and the counter and limiter system reset.

These and other objects of the present invention will become readily apparent from a consideration of the following specification and claims taken in conjunction with the accompanying drawings.

BEST MODE FOR CARRYING OUT THE INVENTION

Figure 1:
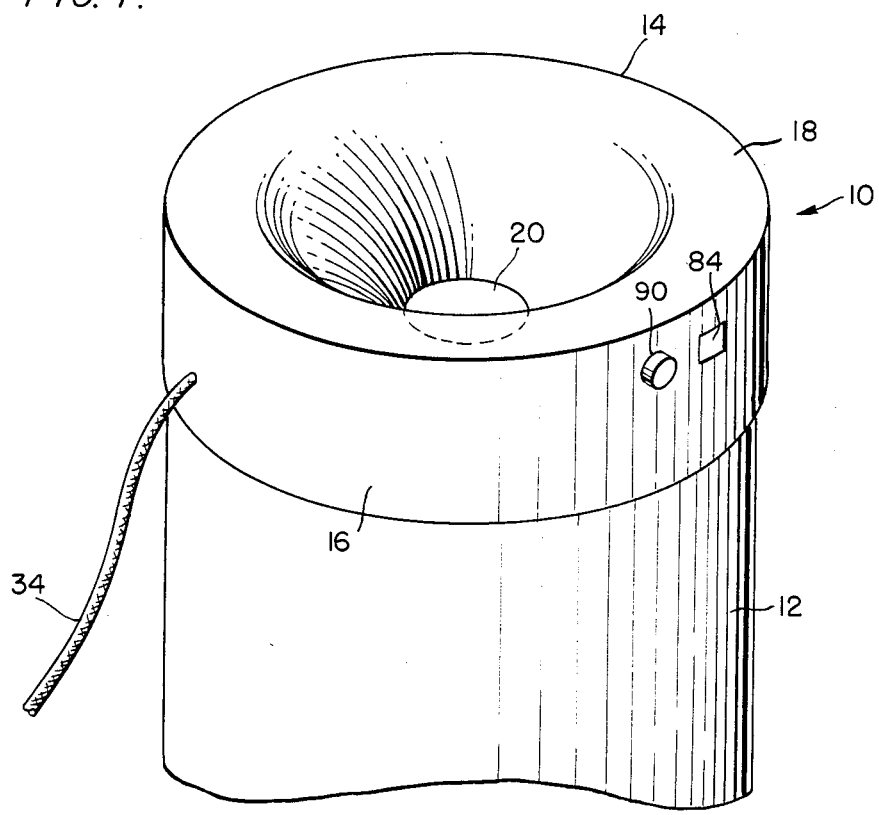
FIG. 1 is a perspective view showing the empty can counter and limiter of the present invention mounted upon a can receiving receptacle.
Figure 2:
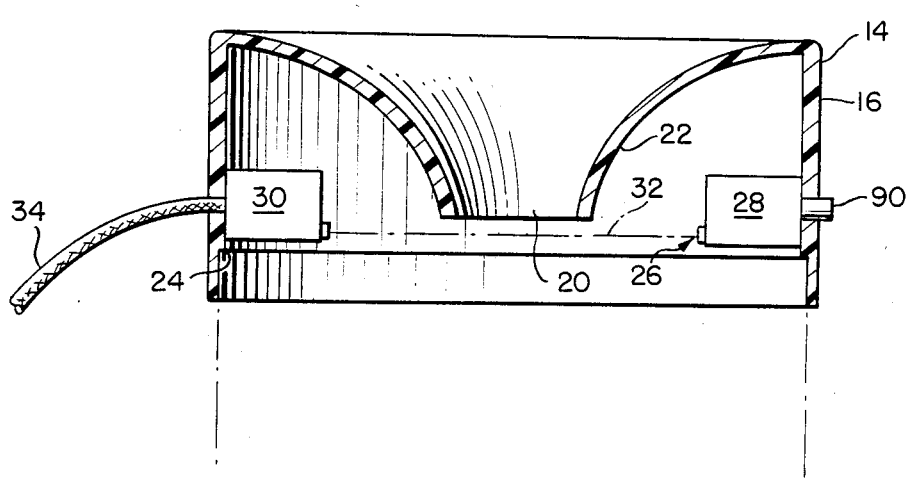
FIG. 2 is a cross sectional view of the empty can counter and limiter of FIG. 1.

Referring now to the drawings, the empty can counter and limiter of the present invention indicated generally at 10 is adapted to be mounted upon a receptacle 12 of plastic or similar material having an open top and normally being adapted to contain a plastic bag or similar receiver for empty cans. The empty can counter and limiter includes a unitary housing structure 14 which forms a top or closure for the receptacle 12 and which may be molded from plastic or similar material. This housing structure is formed with a downwardly depending sidewall 16 and a top wall 18 formed integrally with the sidewall. The top wall is provided with a centrally located opening 20 which is positioned well below the upper extremity of the sidewall 14, and the top wall extends annularly of the opening 20 and arcuately upwardly therefrom to provide a central spout portion 22 terminating at the opening. The spout and the opening 20 are of sufficient diameter to pass a single can of the conventional 12 to 16 ounce size, but the spout and opening are contoured so as to pass only one can at a time within this size range. The arcuate contour of the top wall 18 leading to the spout 22 is such that a can tossed into the depressed top wall section will be vertically oriented to slide into the spout 22 and then through the opening 20. This is due to the arcuate configuration of the top wall which terminates in the relatively narrow spout 22 and the fact that the opening 20 is located below the upper extremity of the side wall 14 for a distance at least equal to one-half the length of the longest can to be received thereby. This causes a can to become vertically rather than horizontally oriented as it moves downwardly in contact with the arcuate portion of the top wall 18.

The side wall 16 of the unitary housing structure may be provided with an inwardly extending flange or rib 24 which is spaced upwardly from the lower extremity thereof and which is adapted to engage the upper edge at the open end of the receptacle 12. This provides room to mount the electrical circuitry 26 for the empty can counter and limiter including optical transmitter circuitry 28 and optical receiver circuitry 30 on the interior surface of the side wall 16 and spaced above the receptacle 12. However, portions of the transmitter and receiver circuitry are spaced below the opening 20 in the spout 22 so that an optical beam 32 can be generated between the transmitter and receiver circuitry below the spout and across the opening 20.

Figure 3:
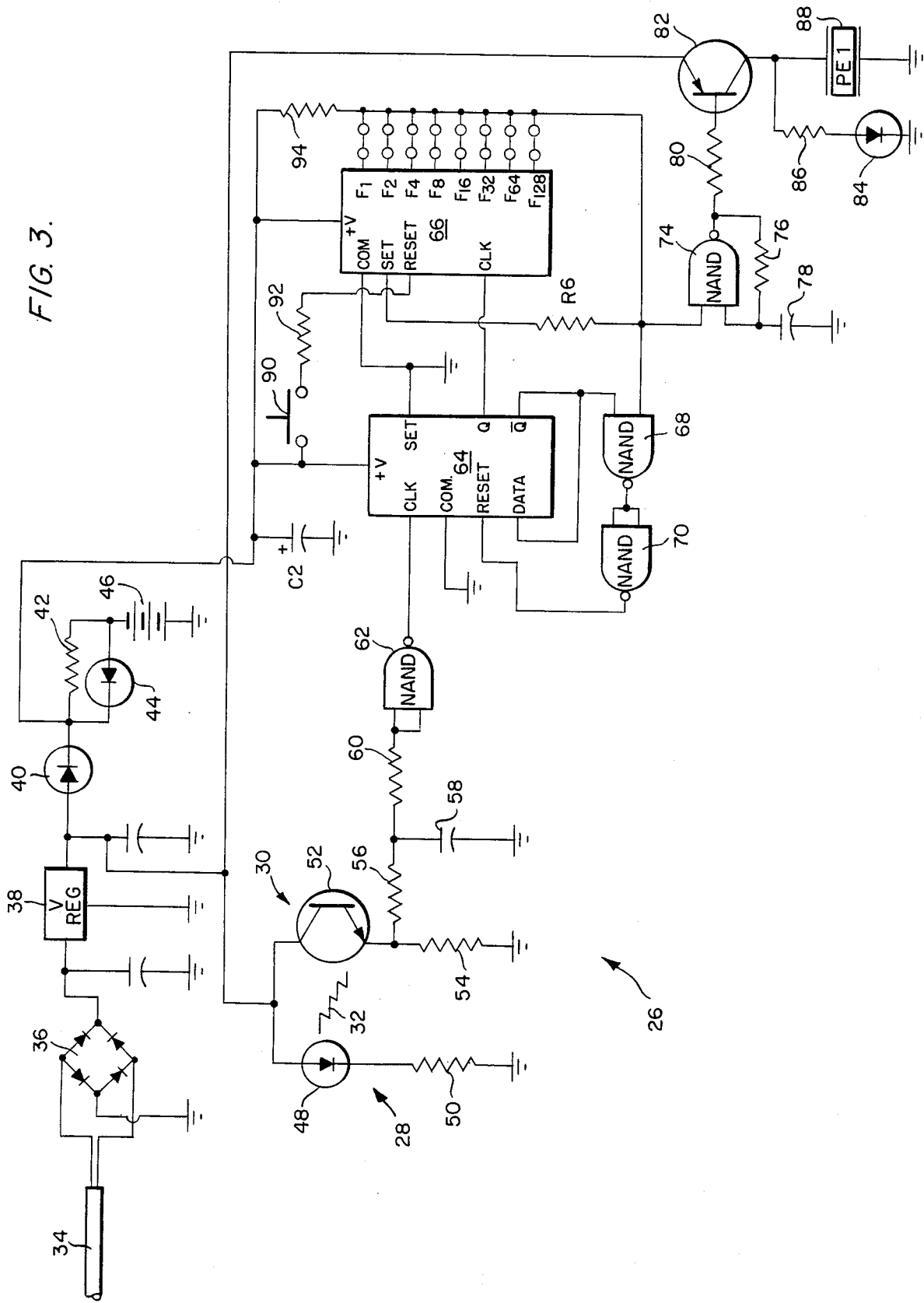
FIG. 3 is a circuit diagram illustrating the electrical circuit for the empty can counter and limiter of FIG. 1.

Referring now to FIG. 3, the electrical circuit 26 of the empty can counter and limiter normally receives power from a power cord 34 connected to a conventional 110 volt 60 Hz. power source. The input power supply is rectified in a full wave rectifier 36 and is converted to a 12 volt, 1 amp supply by voltage regulator 38. This supply from the voltage regulator is normally directed to the optical transmitter and receiver sections 28 and 30 and is also supplied by means of a diode 40 to provide power to the remainder of the electrical circuit 26. A resistor 42 and diode 44 extend between an auxiliary battery 46 and the output side of the diode 40.

The optical transmitter 28 includes a light emitting diode 48 which receives power from the voltage regulator 38 and is connected to ground by a ground resistor 50. When power is supplied to the circuit by the cord 34, the light emitting diode 48 is illuminated, and provides the beam of light 32 which is received by a phototransistor 52 in the optical receiver 30. The phototransistor is powered from the voltage regulator 38, and upon receipt of the light beam 32, is rendered conductive. When the phototransistor 52 is conducting, a high voltage signal is developed across a resistor 54.

The output of the phototransistor 52 is connected by means of a low pass filter consisting of a resistor 56 and a capacitor 58 to the input resistor 60 for a NAND gate 62. This NAND gate constitutes a two input gate which is connected as an inverter, and the output of the NAND gate drives the clock input of a flip flop divider 64. The divider 64 consists of a conventional dual-D flip-flop which is connected as a divide by two binary divider, and which provides an output from the "Q" output terminal thereof to drive the clock input of an eight bit counter 66. The outputs of this counter are "open collector" which permits them to be connected in a wired-AND configuration, so that at the start of a count, the output of the counter is low. However, when a predetermined count which has been preset into the counter is reached, the output goes high. This state is detected by the wired AND gate formed by the gates 68 and 70 which operate in response to a high counter output to reset the flip flop 64 to an initial starting state. Also, the high output from the counter activates a gate 74 which is connected with a feed back resistor 76 and capacitor 78 to operate as an astable oscillator and develop an oscillating signal across a base resistor 80 for a transistor driver 82. This causes the transistor driver to alternately active a light emitting diode indicator 84 across a resistor 86 and an audible piezo electric alarm 88. The light indicator 84 and the audible alarm 88 will be activated until a reset switch 90 is manually closed to provide a reset signal across a resistor 92 to reset the counter 66. This counter reset can only occur in response to a high output from the counter across a resistor 94, and activation of the reset switch 90 at any other time causes a signal to develop across the resistor 92 which is of insufficient amplitude to reset the counter 66. Thus accidential closing of the reset switch 90 before the counter has registered the predetermined count will not cause zeroing of the counter. The reset switch may be a spring pressure switch which returns to a open position after being momentarily closed by manual actuation.

In the event of a power failure, power for the system can no longer be obtained from the power line 34, and the auxiliary battery 46 provides power across the diode 44 to maintain the count previously registered by the counter 66. The battery 46 may constitute a five volt nickel cadimum battery which will provide standby DC voltage of sufficient magnitude to maintain the count in the counter 66 for up to 36 hours.

When a can passing through the opening 20 interrupts the beam 32, a high to low to high voltage signal is developed across the resistor 54 due to the fact that the phototransistor 52 switches from a fully conducting to a fully non-conducting condition and then back to a fully conducting condition. The low pass filter formed by the resistor 56 and the capacitor 58 integrates this signal to remove discontinuity along the leading and trailing edges thereof, and the NAND gate inverter 62 acts to reduce the signal rise and fall times to something less than 5 microseconds. The output of this NAND gate inverter then drives the clock input of the flip flop 64 which provides a single count pulse to the counter 66.

INDUSTRIAL APPLICABILITY

The empty can counter and limiter 10 is a lightweight unitary structure which may be fit on the top of standard open top receptacles used in existing systems of can redemption. The contoured top wall 18 of the unitary molded housing structure 14 operates to orient each can in a vertical attitude so that cans can only pass individually through the aperture 20. It should be recognized that this contour can be incorporated in the top wall of square, rectangular and round housing structures 14, and therefore the structure can be configured to fit a multiplicity of receptacles. The electronic circuitry 26 for the empty can counter and limiter will register a number of empty cans up a preset amount, at which time a dual alarm system alerts an operator by providing both an audible alarm and a visual light signal by illuminating the diode 84. At this point, the operator can press a reset switch 90 to turn off the alarms and reset the electronic counter within the system to zero, but this reset can only occur when the count is complete and the alarms are activated. The counter ignores a reset at any other time in the cycle, thus preventing an accidental interruption of the count.

In the case of a power failure, the empty can counter and limiter 10 includes an auxiliary battery which will provide power to maintain the count already accumulated in the system until primary power resumption occurs.

I claim:

1. An empty can counter and limiter to receive cans having a length and diameter which is designed for use with an open top receptacle and adapted to be removably mounted on said receptacle to extend across the open top thereof comprising a unitary housing structure having sidewall means for engaging said receptacle and contoured topwall means extending from the upper extremity of said sidewall means across an area defined by said sidewall means, said topwall means having a substantially central aperture formed therein at the lowermost extremity thereof which is spaced above the lowermost extremity of said sidewall means, said topwall means being contoured to extend annularly relative to said aperture and arcuately upwardly therefrom to cause a can placed on said topwall means to assume a lengthwise position and move by gravity through said aperture, sensing means mounted on said housing and being positioned within said housing adjacent to said aperture to sense the passage of a can through said aperture and to provide an electrical output signal in response thereto, and electrical counting and indicator circuit means mounted within said housing and operative in response to said electrical output signal to register a count, and reset circuit means operative to reset said electrical counting and indicator means only upon the registration thereby of a predetermined count.

2. The empty can counter and limiter of claim 1, wherein said topwall is contoured to position said aperture at the lowermost extremity of said topwall but spaced above the lowermost extremity of said sidewall means.

3. The empty can counter and limiter of claim 2, wherein said sensing means includes light transmission means mounted upon said housing structure and operative to transmit a beam of light below said topwall and across said aperture, and photosensitive light receiving means mounted upon said housing structure and positioned to receive said beam of light.

4. The empty can counter and limiter of claim 1 wherein said electrical counting and indicator circuit means is operative to provide both a visual and an audible alarm upon the registration thereby of said predetermined count.

5. An empty can counter and limiter for use with an open top receptacle and adapted to be removably mounted on said receptacle to extend across the open top thereof comprising a unitary housing structure having sidewall means for engaging said receptacle and a contoured topwall extending from the upper extremity of said sidewall means across an area defined by said sidewall means, said topwall having a substantially central aperture formed therein and being contoured to extend annularly relative to said aperture and arcuately upwardly therefrom, sensing means mounted on said housing and being positioned within said housing to sense the passage of a can through said aperture and to provide an electrical output signal in response thereto, and electrical counting and indicator circuit means mounted within said housing and operative in response to said electrical output signal to register a count, said electrical counting and indicator means including counter means responsive to each said electrical output signal to register a count and to provide an alarm actuating signal when said predetermined count is registered thereby, and reset circuit means including a reset switch operative to reset said counter means after said predetermined count has been registered, said reset circuit means operating upon actuation of said reset switch to reset said counter means only when said counter means has registered said predetermined count.

6. The empty can counter and limiter of claim 1 wherein said sensing means includes means responsive to the passage of a can through said aperture to provide a high to low to high voltage output signal, filter means connected to integrate said output signal and to provide an integrated signal, inverter means connected to receive the integrated signal and to reduce the integrated signal rise and fall times, the output of said inverter means being provided as an input to a divide by two binary divider means, said divide by two binary divider means being connected to provide said electrical output signal to said electrical counting and indicator circuit means.

7. The empty can counter and limiter of claim 1 wherein said sensing means responsive to the passage of a can through said aperture includes light transmission means to create a beam of light to be broken by the passage of a can through said aperture, and light receiving means to receive said beam of light, said light receiving means including a photosensitive transistor means which is conductive in response to reception of said beam of light.

8. The empty can counter and limiter of claim 7 wherein said electrical counting and indicator circuit means includes counter means responsive to each said electrical output signal to register a count and to provide an alarm actuating signal when said predetermined count is registered thereby, and reset circuit means including a reset switch operative to reset said counter means after said alarm actuating signal has been provided, said reset circuit means operating upon actuation of said reset switch to reset said counter means only when said counter means has registered said predetermined count.

9. The empty can counter and limiter of claim 8 wherein said electrical counting and indicator means includes alarm means operative in response to said alarm actuating signal to provide both a visual and an audible alarm.

* * * * *